United States Patent [19]

Nath

[11] Patent Number: 4,540,601

[45] Date of Patent: Sep. 10, 1985

[54] ALUMINUM OXIDE OPTICAL FIBER COATING

[75] Inventor: Dilip K. Nath, Framingham, Mass.

[73] Assignee: Aetna Telecommunications Laboratories, Westborough, Mass.

[21] Appl. No.: 636,368

[22] Filed: Jul. 31, 1984

[51] Int. Cl.$^3$ ............................. G02B 5/14; G02B 1/10
[52] U.S. Cl. .................................. 427/163; 65/3.12; 350/96.29
[58] Field of Search .................. 427/163; 65/3.12; 350/96.29

[56] References Cited

U.S. PATENT DOCUMENTS 4,465,739  8/1984  Yoldas ........................ 427/163 X
4,473,599  9/1984  Elion ........................... 427/163

Primary Examiner—James R. Hoffman
Attorney, Agent, or Firm—Weingarten, Schurgin, Gagnebin & Hayes

[57] ABSTRACT

A process whereby an optical fiber is hermetically coated with a layer of aluminum oxide. The fiber is reacted pyrolytically with organo aluminum derivatives or other aluminum compounds, either in the form of vapor or atomized spray, to produce the desired coating. The thickness can be varied by changing reaction parameters. A buffer is also applied to the coated fiber. The end product is a glass fiber impervious to gases and fluids in the environment, especially $H_2O$, and one of improved abrasion resistance, hardness and strength.

18 Claims, 4 Drawing Figures

ALUMINUM OXIDE OPTICAL FIBER COATING

FIELD OF THE INVENTION

The present invention relates to optical fibers, especially to coating those fibers with aluminum oxide.

BACKGROUND OF THE INVENTION

Optical fibers must withstand environmental attack, particularly at flaw sites where chemical weakening progresses rapidly. Particularly harmful are environments of extreme temperature and pressure. Therefore, the fibers must be treated to maintain durability and reliability under such conditions.

Several types of coatings have been utilized in an attempt to protect the fibers from external attack. Various metal coatings were not efficient because they conducted both heat and electricity and failed to provide adequate protection. Plastic coatings did not provide adequate protection against water damage. Ceramic coatings have also been used, but they possess expansion coefficients different from those of the fiber leading to initial strength degradation.

There also appear to be difficulties in adhesions between the fiber coatings and the plastic buffer layer subsequently applied. Bubbles or pockets that result between the coated fiber and buffer may lead to physical degradation of the fiber.

The present invention relates to a method of coating optical fibers with aluminum oxide. The protective layer prevents flaw sites on the glass surface from environmental attack leading to stress corrosion and breakage.

SUMMARY OF THE INVENTION

According to the present invention, an optical fiber is pyrolytically coated with aluminum oxide to yield a fiber of increased strength and durability. The process begins with a fiber drawn from a preform or mandrel in a drawing furnace. The drawn fiber is passed through a heated reactor without exposure to the outside air. In the reactor, the fiber is exposed to aluminum esters or other aluminum compounds which are converted pyrolytically into aluminum oxide which deposits on the drawn fiber. The drawn fiber is coated, typically in a continuous process, where each fiber portion receives an exposure to depositing aluminum oxide for a predetermined time interval.

The coated fiber may then be treated with one or more conventional polymer or other protective layers. The polymer coated fibers are then wound on a spool.

DESCRIPTION OF THE DRAWINGS

These and other features of the present invention are described more fully in the following solely exemplary detailed description and accompanying drawing of which.

DESCRIPTION OF THE INVENTION

The present invention contemplates a process of coating optical fibers with aluminum oxide to impart an increased resistance to environmental attack as well as improved strength.

Figure 1:
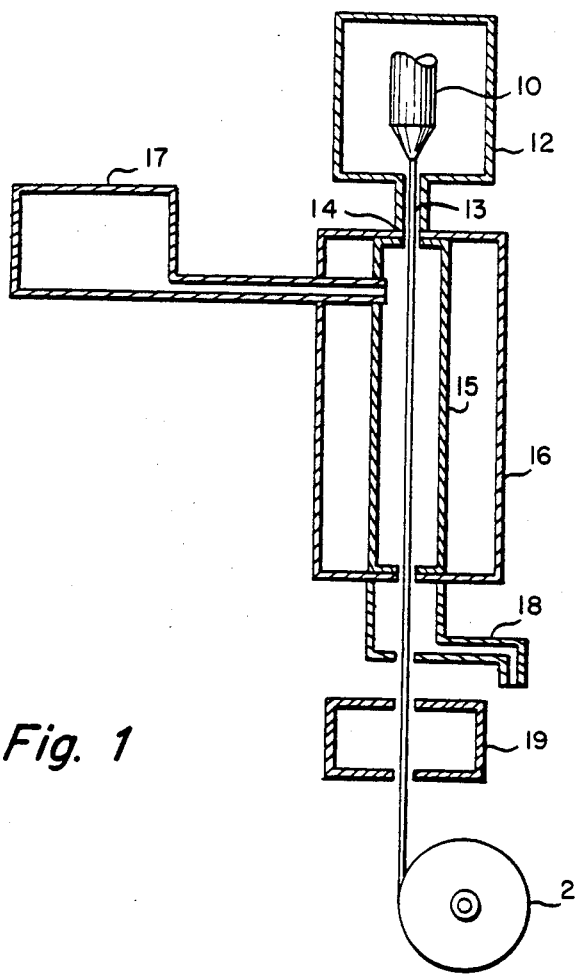
FIG. 1 is a diagrammatic view of apparatus used to coat an optical fiber according to the present invention.
Figure 2A:
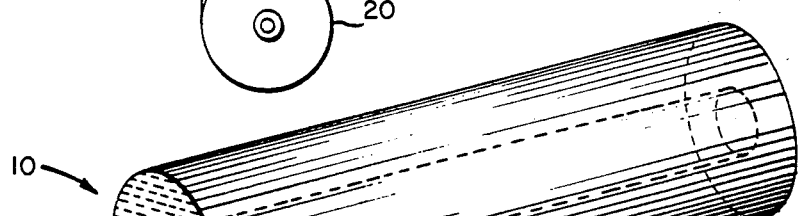
FIGS. 2A-2C perspectively show stages in the formation of the coated fiber, from the preform to polymer buffered fiber, according to the present invention.

A preferred process according to invention begins with a fiber preform 10 as shown in FIG. 1. The preform 10 (also shown as 1 in FIG. 2A) is a glass cylinder suitable for drawing and having dimensions of from 10 to 60 mm in diameter and 500 to 2000 mm in length. The preform 10 also contains one or more dopant materials to achieve a desired optical property for transmission of information modulated light. Structurally, the preform 10 consists of a central core portion 24 possessing a higher index of refraction than a peripheral ladding 26, as shown in FIG. 2A.

The preform 10 is drawn in a furnace 12, in FIG. 1, in which exists an ultra clean atmosphere. The resulting fiber 13, shown in FIG. 2B and drawn from the neckdown region of preform 11, is then passed through a controlled atmosphere chamber 14 to avoid any contamination (including H2O) from the ambient environment. Fiber 13 then passes into a reactor 15 which is connected to chamber 14. Reactor 15 is heated to a temperature having one or more zone by furnace 16 such that chemical conversion of precursors in the reactor 15 proceeds to yield particulate aluminum oxide. A chemical delivery system 17 may include nebulizers, scrubbers and bubblers or other means to generate, clean and transport vapors of aluminum organo derivatives, for example aluminum isopropoxide, by a non-reactive carrier gas (e.g., nitrogen, or other suitable gases) under controllable feed to the reactor 15 where the fiber is coated by aluminum oxide. The delivery system 17 is not restricted to the present embodiment and can be modified to any suitable form that would introduce the precursors at controlled rates to reactor 15 such that they form aluminum oxide as in the following reaction given as an example.

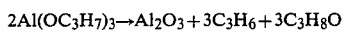

$$2Al(OC_3H_7)_3 \rightarrow Al_2O_3 + 3C_3H_6 + 3C_3H_8O$$

Other reactions for different esters may be used. The chemical nature of the precursors is not restricted to aluminum esters only and can include their derivatives which can be formed by alcoholysis, acidolysis, chlorolysis or similar conventional reactions which substitute the alkyl groups of the aluminum ester.

The reaction temperature is adjustable and depends upon the particular reaction taking place. For example, aluminum isopropoxide can be pyrolytically decomposed to aluminum oxide at 200° C. and above. Aluminum butoxide is preferably heated to 450° C. to form the coating on the glass fiber. Purge-gases, not shown in FIG. 1, are used to carefully control the atmosphere in reactor 15 by conventional means. Exhaust port 18 is connected to a scrubber system, not shown, and is intended to keep reactor 15 as clean as possible by exerting a lower atmospheric pressure.

Figure 2B:

As shown by FIG. 2B, the fiber 13 is hermetically sealed with a thin clear amorphous layer 28 of aluminum oxide after having passed through reactor 15. The thickness of the film varies from several angstroms to ten of thousands of angstroms and depends upon such process parameters as concentration and volumetric flow rates of chemicals, temperature of the reactor, and fiber drawing speed. The film of aluminum oxide, unlike metal or silicon nitride type inorganic coatings, is very stable in many physical or chemical properties. For example, adhesion of the oxide film to silica glass fibers is much better than that present with metal or silicon nitride types of inorganic coatings.

Figure 2C:
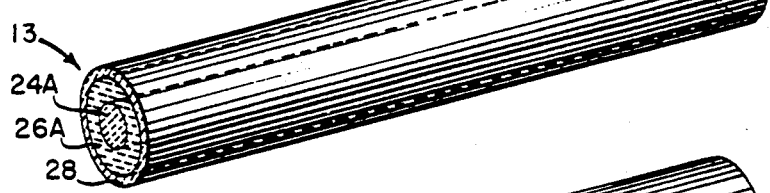

A conventional polymer coating is typically applied in a chamber 19 to aluminum oxide coated fiber 13, resulting in a fiber 30 of FIG. 2C. One or several coatings 32 with one or more polymer coating operations may be used, wherein the curing processes includes thermal or ultraviolet radiation. No details need be provided because the polymer coating processes are known. The buffer coated fiber 13 in FIG. 1 is finally wound on a spool 20.

Typical examples of fiber coating steps in accordance with the present invention are illustrated below:

EXAMPLE 1

Nitrogen gas is fed into the reactor 15 of FIG. 1 after having passing through a bubbler containing molten aluminum isopropoxide at a flow rate of 4000 ml/minute. Reactor 15 is maintained at a temperature of 400° C. Exhaust port 8 is connected to reactor 15 such that a constant flow of gases is maintained during the passage of fiber 13 through the reactor. Fiber 13, after receiving the aluminum oxide layer 28, is coated with one or several polymer layers.

EXAMPLE 2

The reactant gas in Example 1 is replaced by molten aluminum butoxide. The temperature inside the reactor is maintained at 450° C.

The above-described process and resulting product achieve an enhancement in optical fibers by increasing their tensile strength by 50% or more and raising their environmental immunity. The benefits of this invention may be achieved by other specific ways within the scope of the invention, as specified in the following claims.

What is claimed is:

1. A process for providing a coated optical fiber comprising:
   providing a glass preform of a type adapted to be drawn into an optical fiber;
   drawing the preform into the dimensions of an optical fiber; and
   pyrolytically decomposing an aluminum ester or derivative thereof in the presence of said optical fiber immediately after drawing said fiber to form an aluminum oxide coating thereon.

2. The process of claim 1, wherein the step of pyrolytically decomposing includes providing an H$_2$O limited atmosphere in the environment of the drawn fiber.

3. The process of claim 2, wherein said step of pyrolytically decomposing includes the step of leading the fiber through a multi-temperature zone reaction chamber.

4. The process of claim 3, further including applying a non-reactive carrier gas to transport said aluminum ester to said drawn optical fiber.

5. The process of claim 4, further including the step of controlling the feed rate of said carrier gas.

6. The process of claim 5, further including the step of scrubbing said carrier gas prior to the application thereof to said optical fiber.

7. The process of claim 1, performed according to the equation:

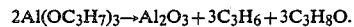

$$2Al(OC_3H_7)_3 \rightarrow Al_2O_3 + 3C_3H_6 + 3C_3H_8O.$$

8. The process of claim 1, wherein the step of pyrolytically reacting includes pyrolytically decomposing aluminum isopropoxide at a temperature at or near 400° C.

9. The process of claim 1, wherein the step of pyrolytically reacting includes the step of pyrolytically decomposing aluminum butoxide at a temperature at or near 450° C.

10. An optical fiber having a high purity aluminum oxide coating produced according to the process comprising:
    providing a glass preform of a type adapted to be drawn into an optical fiber;
    drawing the preform into the dimensions of an optical fiber; and
    coating said optical fiber immediately after drawing with a pyrolytically decomposed aluminum ester compound or derivative thereof to form an aluminum oxide coating thereon.

11. The product of claim 10, wherein the process includes the step of limiting H$_2$O in the environment of the drawn fiber coating.

12. The product of claim 11, wherein the process includes the step of leading the fiber through a multi-temperature zone reaction chamber.

13. The product of claim 12, wherein the process includes the step of applying a non-reactive carrier gas to transport said aluminum ester to said drawn optical fiber.

14. The product of claim 13, wherein the process includes the step of controlling the feed rate of said carrier gas.

15. The product of claim 14, wherein the process includes the step of scrubbing said carrier gas prior to the application thereof to said optical fiber.

16. The product of claim 10, wherein the process includes the step of performing the process according to the equation:

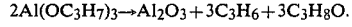

$$2Al(OC_3H_7)_3 \rightarrow Al_2O_3 + 3C_3H_6 + 3C_3H_8O.$$

17. The product of claim 10, wherein the process includes the step of pyrolytically decomposing aluminum isopropoxide in a reaction chamber having a temperature at or near 400° C.

18. The product of claim 10, wherein the process includes the step of pyrolytically decomposing aluminum butoxide in a reaction chamber at a temperature at or near 450° C.

* * * * *